(12) United States Patent  (10) Patent No.: US 6,630,627 B1
Tobita  (45) Date of Patent: Oct. 7, 2003

(54) MULTILAYERED WIRING SUBSTRATE WITH DUMMY WIRINGS IN PARALLEL TO SIGNAL WIRINGS AND WITH

(76) Inventor: Youichi Tobita, c/o Mitsubishi Denki Kabushiki Kaisha, 2-3, Marunouchi 2-chome, Chiyoda-ku, Tokyo (JP), 100-8310

( * ) Notice: Subject to any disclaimer, the term of this patent is extended or adjusted under 35 U.S.C. 154(b) by 319 days.

(21) Appl. No.: 09/664,361

(22) Filed: Sep. 18, 2000

(30) Foreign Application Priority Data

Sep. 29, 1999 (JP) .......................................... P11-276488

(51) Int. Cl.[7] .................................................. H05K 1/03
(52) U.S. Cl. ........................ 174/255; 174/264; 361/780; 361/794; 361/795
(58) Field of Search ................................ 174/261, 262, 174/263, 264, 265, 266; 361/780, 792, 793, 794, 795

(56) References Cited

FOREIGN PATENT DOCUMENTS

JP 4-170788 6/1992

Primary Examiner—David L. Talbott
Assistant Examiner—José H. Alcalá

(57) ABSTRACT

Each wiring layer of a multilayered wiring substrate includes signal wirings disposed in parallel with one another, and dummy wirings disposed at each side parallel to the signal wirings of the signal wiring group made by signal wiring, respectively. The dummy wirings have the same shape as the signal wirings, and are disposed in parallel to the signal wirings at the same intervals as that in the signal wirings. Through holes are formed in the respective clearances among the signal wirings. Dummy through holes having the same shape as the through holes are formed between the dummy wiring and signal wiring. A conductive layer is formed on the inner wall of the through holes. The multilayered wiring substrate is able to reduce or eliminate the delay time difference between signals that propagate along the signal wirings.

11 Claims, 11 Drawing Sheets

MULTILAYERED WIRING SUBSTRATE WITH DUMMY WIRINGS IN PARALLEL TO SIGNAL WIRINGS AND WITH

BACKGROUND OF THE INVENTION

1. Field of the Invention

The present invention relates to a printed (wiring) substrate or board and, in particular, to a multilayered wiring substrate or board having a plurality of multilayered wiring layers. The invention involves a technique of improving the difference in propagation delay time (hereinafter also referred to simply as "delay time") between signals propagating along a plurality of wirings that form the respective wiring layers.

2. Description of the Background Art

Figure 15:
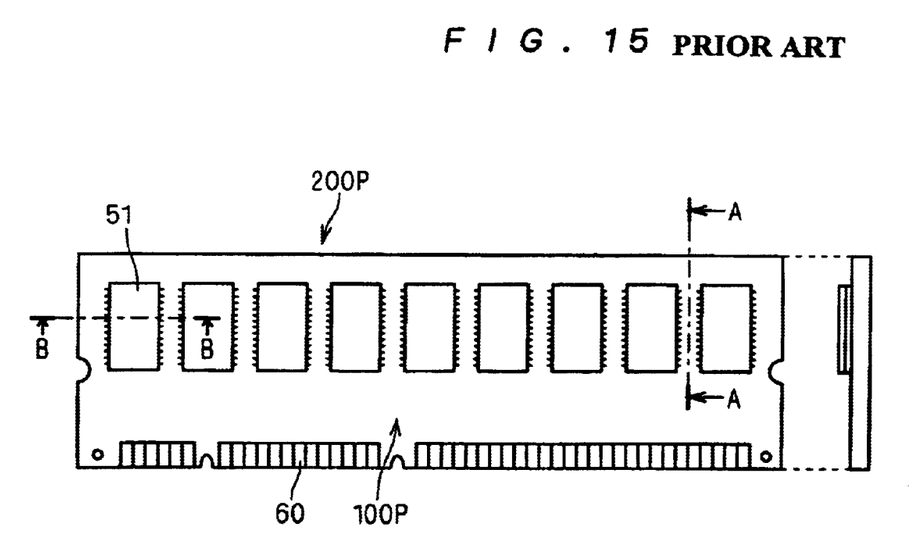
FIG. 15 is a diagram of appearances of a memory module using a conventional multilayered wiring substrate.

FIG. 15 shows appearances of a conventional memory module 200P (i.e., its top plan view and side view). In FIG. 15, the illustration of detailed wiring is omitted.

Referring to FIG. 15, in the memory module 200P a plurality of (nine in the figure) DRAMs (Dynamic Random Access Memory) 51 are mounted on a conventional multilayered wiring substrate 100P. The substrate 100P is provided with a plurality of external terminals 60, through which sending and/or receiving of signals and supply of power are performed between the DRAMs 51 and an external system or external circuit (not shown).

Figure 16:
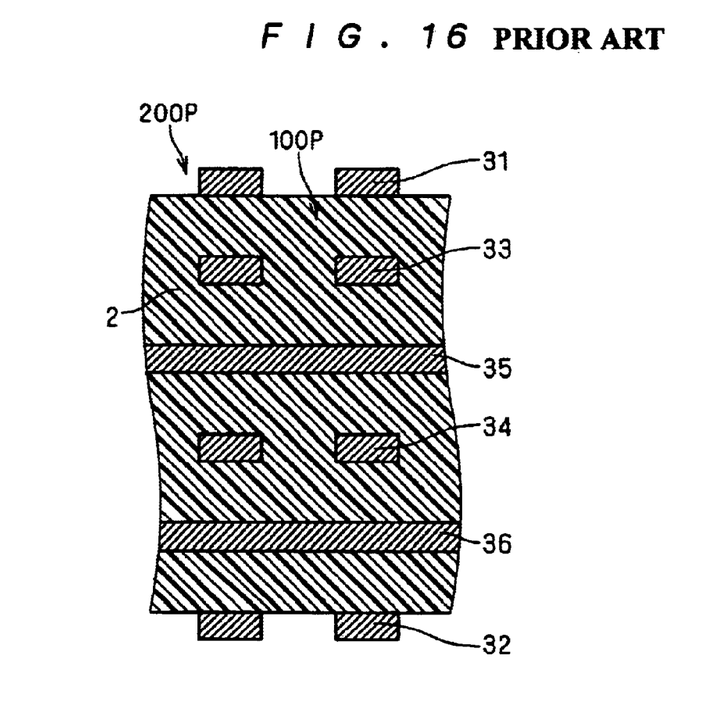
FIG. 16 is a schematic longitudinal section of a conventional multilayered wiring substrate.

FIG. 16 is a schematic longitudinal section of the multilayered wiring substrate 100P taken along the line A—A of FIG. 15. The substrate 100P has six multilayered wiring layers, and wirings that form their respective wiring layers are isolated by an insulating material 2, such as glass epoxy material. Specifically, signal wiring groups 31 and 32, each forming a signal wiring layer, are disposed on both surfaces (main surfaces) of the multilayered wiring substrate 100P, respectively. Signal wiring groups 33 and 34, each forming a signal wiring layer, and a ground wiring (layer) 35, and a power supply wiring (layer) 36 are disposed inside the multilayered wiring substrate 100P. The signal wiring groups 31 to 34 are used for transferring, for example, an address signal relative to the operation of the DRAM 51. The ground wiring 35 and power supply wiring 36 are used for supplying a ground potential and a power supply potential to a ground terminal and a power supply terminal of the DRAM 51, respectively.

Figure 17:
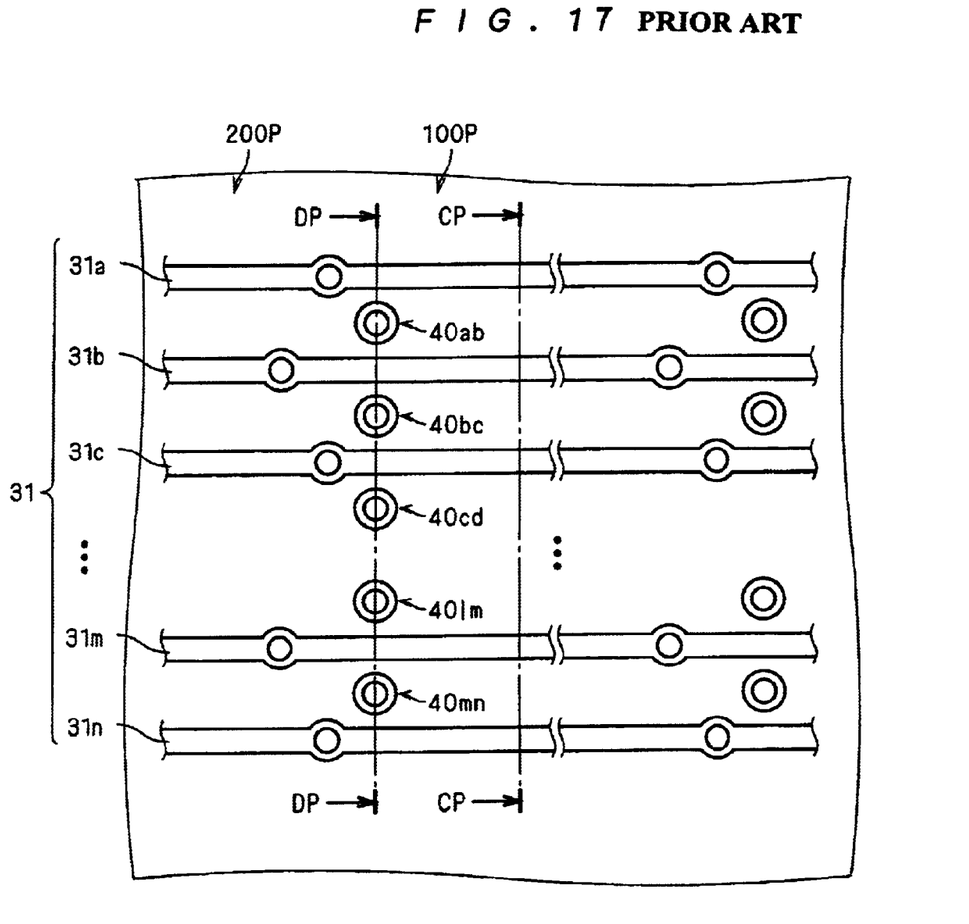
FIG. 17 is a schematic top plan view of a wiring layer in the conventional multilayered wiring substrate.

FIG. 17 is a schematic top plan view of a signal wiring layer formed from a signal wiring group 31, as an example of wiring layers. As shown in FIG. 17, the signal wiring group 31 is composed of n strip-like signal wirings 31a to 31n which transfer, for example, an address signal of the DRAM 51. The signal wirings 31a to 31n are disposed in this order, so as to be parallel with one another.

In general, the signal wirings that form the signal wiring groups 31 and 32 on the surface of the multilayered wiring substrate 100P, are composed of a copper foil having a thickness of about 20 μm, and a copper plating film that has a thickness of about 20 microns and is disposed on the copper foil surface. The signal wirings that form the signal wiring groups 33 and 34 in the multilayered wiring substrate 100P, are composed of a copper foil having a thickness of about 40 μm. The signal wirings that form the signal wiring groups 31 to 34 have a width of about 100 to 200 μm, and the wiring interval of a wiring pattern is about 100 to 200 μm. On the other hand, the ground wiring 35 and power supply wiring 36 are composed of a plane copper foil having a thickness of about 40 μm. The length of the signal wirings that form the signal wiring groups 31 to 34 is about the same as the lateral width of the memory module 200P (i.e., the dimension in right-to-left direction in FIG. 15), and it is usually about ten and several centimeters.

Figure 18:
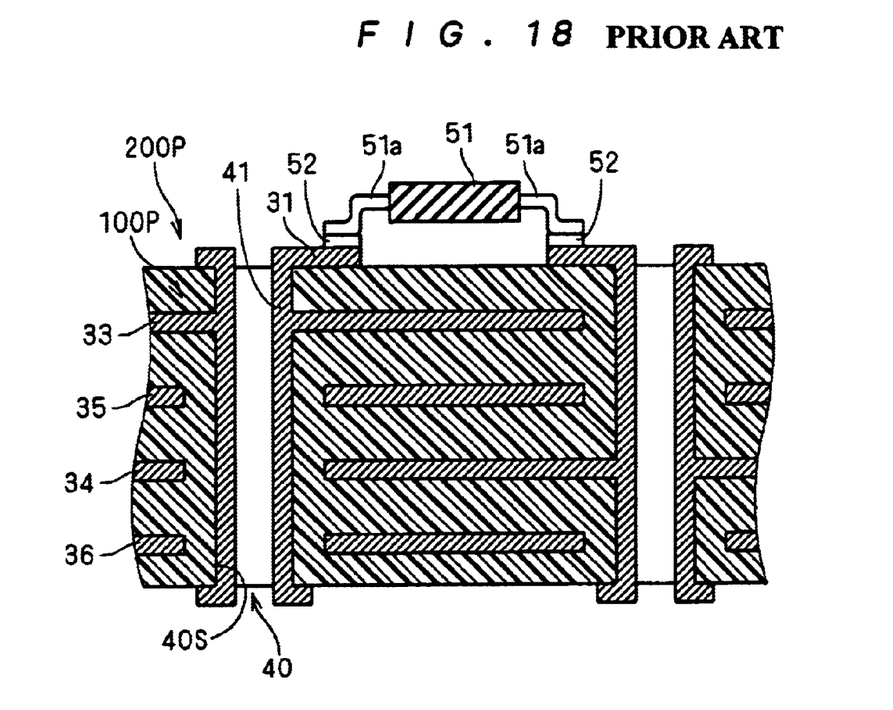
FIG. 18 is a schematic longitudinal section of the conventional multilayered wiring substrate.

FIG. 18 is a schematic longitudinal section of the multilayered wiring substrate 100P or memory module 200P taken along the line B—B of FIG. 15. As shown in FIG. 18, there is formed a through hole 40 extending through in the direction of thickness of the multilayered wiring substrate 100P. The through hole 40 has a diameter of about 250 μm, and is bored by means such as a drill. A conductive layer 41 having a thickness of about 20 μm is formed on the inner wall or side wall 40S of the through hole 40. The conductive layer 41 is formed at the same time that the signal wiring groups 31 and 32 on the surface of the multilayered wiring substrate 100P are formed by copper plating. Referring again to FIG. 17, through holes 40ab to 40mn are interposed among the signal wirings 31a to 31n.

The through hole 40 and conductive layer 41 establish a connection between predetermined layers selected from the wiring layers formed from the signal wiring groups 31 to 34, the ground wiring layer 35, and the power supply wiring layer 36. For instance, as shown in FIG. 18, the wiring layers made by the signal wiring groups 33 and 34, respectively, are connected to the wiring layer made by the signal wiring group 31. The pad of one signal wiring in the signal wiring group 31 is connected via a solder 52 to an external lead 51a of the DRAM 51. Thereby, the DRAM 51 is connected to the wiring layers made by the signal wiring groups 33 and 34, or to each signal wiring.

Figure 19:
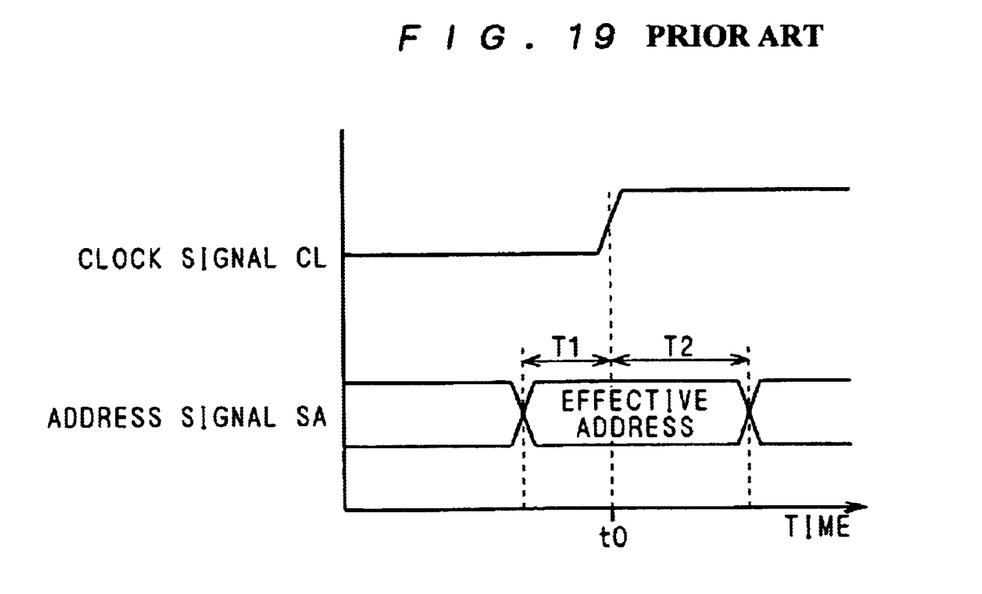
FIG. 19 is a timing chart illustrating timing that a DRAM receives an address signal.

The timing that the DRAM 51 receives an address signal SA will be described by referring to FIG. 19, which illustrates timing charts of a clock signal CL and address signal SA. The DRAM 51 receives the address signal SA at a rise (or fall) t0 of the clock signal CL as a reference time. In order that the address signal SA is surely received and the internal circuit of the DRAM 51 is operated stably, a set up time T1 and hold time T2, each having a predetermined period of time, are provided before and after time t0. For achieving high speed and stable operation of the DRAM 51, it is preferable to provide a greater operation margin to the set up time T1 and to the hold time T2.

When a plurality of address signals SA are transferred on different wirings, it is desirable that all the address signals SA propagate simultaneously on the multilayered wiring substrate 100P, and that the DRAM 51 receives them at the same time. By establishing this transfer condition, the above-mentioned margin can be set at a large value, and a high operational stability of the DRAM 51 is obtainable even at high speed operation.

However, the conventional memory module 200P has the following problems in signal propagation. Description will now be made by taking, as an example, a wiring layer made by the above-mentioned signal wiring group 31. The same is true for other wiring layers.

Figure 20:
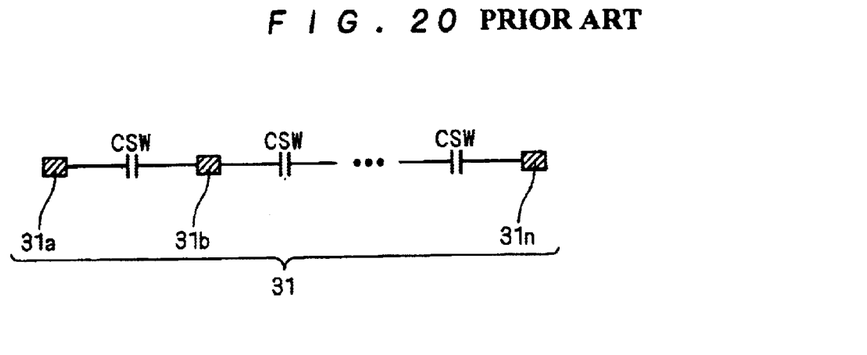
FIG. 20 is a schematic view illustrating a capacitive coupling condition of a plurality of wirings in the conventional multilayered wiring substrate.

It is well known that when a plurality of wirings are disposed in close proximity, these wirings are capacitively coupled via the capacitance (or capacitor) component formed between the wirings. This condition will be described by referring to FIG. 20, which is a schematic longitudinal section of the multilayered wiring substrate 100P taken along the line CP—CP of FIG. 17. As shown in FIG. 20, all the signal wirings 31a to 31n can be schematically illustrated as being in a capacitive coupling in series via a capacitance (or capacitor) CSW between two adjacent signal wirings.

Figure 21:
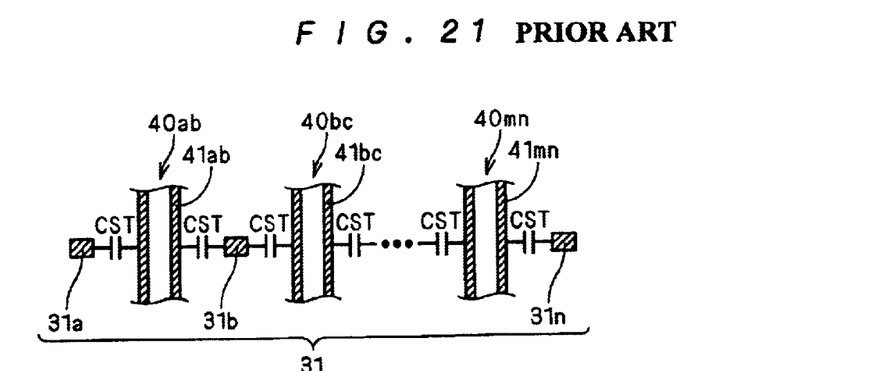
FIG. 21 is a schematic view illustrating a capacitive coupling condition of a plurality of wirings and conductive layers of through holes in the conventional multilayered wiring substrate.

Likewise, when the through holes 40ab to 40mn are interposed among the signal wirings 31a to 31n, as shown in FIG. 17, all the signal wirings 31a to 31n and all the through holes 40ab to 40mn (specifically, all the conductive layers 41ab to 41mn) can be illustrated as shown in FIG. 21, which is a schematic longitudinal section taken along the line DP—DP of FIG. 17. That is, all the signal wirings 31a to 31n and all the conductive layers 41ab to 41mn are capacitively coupled in series via a capacitance (or capacitor) CST between one signal wiring and the conductive layer of one through hole.

Referring again to FIG. 17, one signal wiring and one through hole are disposed on both sides of the signal wirings 31b to 31m except for the outermost signal wirings 31a and 31n. Whereas one signal wiring and one through hole are disposed only on one side of the outermost signal wirings 31a and 31n. Specifically, as shown in FIGS. 20 and 21, two capacitance CSW or two capacitance CST are coupled to the signal wirings 31b to 31m, whereas only one capacitance CSW or capacitance CST is coupled to the outermost signal wirings 31a and 31n.

A propagation delay time per unit of length of wiring tpd is expressed by the following Equation (1):

$$tpd = \sqrt{(L \cdot C)} \tag{1}$$

where L and C represent inductance and capacitance per unit of length of wiring, respectively.

Since the capacitance C contains the capacitance CST or CSW as described above, it can be seen from Equation (1) that a delay time tpd1 of the signal wiring 31a or 31n is smaller than a delay time tpd2 of any of other signal wirings 31b to 31m. Further, in view of the fact that Equation (1) is a relational expression of per unit of length of wiring, it can be seen that these delay time tpd1, tpd2, and a difference therebetween Δ tpd depend on the length of wiring, and their values increase as the length of wiring increases.

Figure 22:
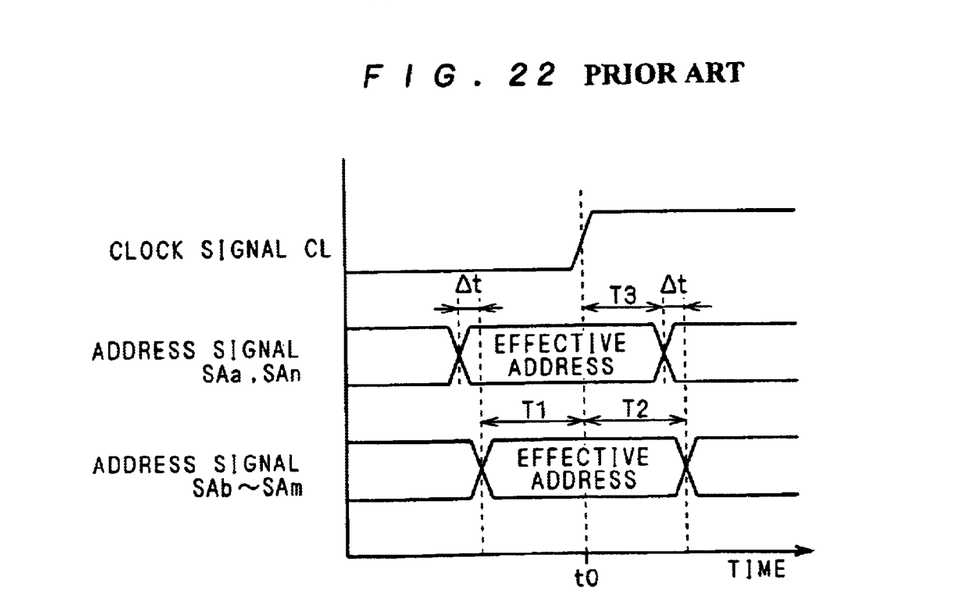
FIG. 22 is a timing chart illustrating timing that a DRAM receives a plurality of address signals having a propagation delay time therebetween.

Referring to timing charts of FIG. 22, it can be seen that since the delay time tpd1 is shorter than the delay time tpd2, address signals SAa and SAn that propagate along the signal wirings 31a and 31n propagate faster than address signals SAb to SAm that propagate along the signal wirings 31b to 31m, by the amount of time Δt (corresponding to the value obtained by multiplying a delay time difference Δtpd by the length of a signal wiring). For obtaining a stable operation of the DRAM 51, it is necessary to set the operating timing of the DRAM 51 by taking into consideration a difference Δt in propagation delay time among the address signals SAa to SAn. That is, a hold time T3 to the address signal SAa and SAn is required to be shorter than a hold time T2 to the address signals SAb to SAm, by the amount of time Δt. This time setting will narrow each margin to the set up time and hold time, thus lowering the stability of the DRAM 51 at high speed operation.

SUMMARY OF THE INVENTION

According to a first aspect of the invention, a multilayered wiring substrate comprising: a plurality of multilayered wiring layers, at least one of the multilayered wiring layers containing a signal wiring group made by a plurality of signal wirings disposed in parallel with one another; and dummy wirings disposed outside said signal group in parallel to the signal wirings, at least one of the dummy wirings being disposed at each side of the signal wiring group.

According to a second aspect, the multilayered wiring substrate of the first aspect further comprises: through holes formed in a stacking direction of the wiring layers and disposed in each clearance between the signal wirings; a dummy through hole extending in the stacking direction, disposed adjacent to the dummy wiring on the side on which the signal wiring group is present; and conductive layers disposed inside the through holes and the dummy through hole, respectively.

According to a third aspect, the multilayered wiring substrate of the second aspect is characterized in that the conductive layer in the dummy through hole is electrically connected to the conductive layer in any one of the through holes.

According to a fourth aspect, the multilayered wiring substrate of the second aspect is characterized in that the conductive layer in the dummy through hole is electrically connected to the dummy wiring.

According to a fifth aspect, the multilayered wiring substrate of the first aspect further comprises at least one resistance having approximately the same impedance as a characteristic impedance of the dummy wiring, and being electrically connected to an end or central part of the dummy wiring.

According to a sixth aspect, the multilayered wiring substrate of the first aspect further comprises at least one terminal for connecting a terminating resistance connected electrically to an end or central part of the dummy wiring.

In the first aspect, the line capacitance of the outermost signal wiring of the signal wiring group can be made equal to that of other signal wirings. Therefore, since the propagation velocity of signals can be made identical, the propagation delay time difference of the signals can be considerably reduced or eliminated. It is therefore able to operate a DRAM stably and reliably even at high speed operation, by taking, for example, such a construction that the multilayered wiring substrate is applied to a memory module and the access signal inputted to the DRAM is transferred by the respective signal wirings.

In the second aspect, the effect resulting from the first aspect can be further improved by the presence of the conductive layer in the dummy through hole.

In the third aspect, electrical influences, such as the field distribution of the conductive layer in the dummy through hole, can be made equal to that of the conductive layer in the through hole to which the conductive layer of the dummy through hole is electrically connected. Thereby, the electrical influence between the dummy through hole and through hole can be made equal to that of the signal wiring between other through holes. This more ensures the effect of the first aspect.

In the fourth aspect, the conductive layer of the dummy through hole is not directly connected to the conductive layer of the through hole, unlike the multilayered wiring substrate of the third aspect. Therefore, when the conductive layer of the through hole is electrically connected to the signal wiring, the conductive layer of the dummy through hole does not serve as load of a signal that propagates along the signal wiring. As a result, the effect of the first aspect is obtained reliably while suppressing an increase in delay of the signal and in its waveform distortion.

In the fifth aspect, the dummy wiring is brought into an impedance matching by the resistance. When signal wirings are used in their impedance matching conditions, the electrical connecting condition of the dummy wiring can be made equal to that of the signal wirings. This more ensures the effect of the first aspect.

In the sixth aspect, since the terminating resistance connected electrically to a terminal for terminating resistance is disposed outside the multilayered wiring substrate, it is easy to set or change the resistance value of the terminating resistance. Hereat, in the above-mentioned memory module, a further reduction in power consumption is attainable, as compared to the case with the multilayered wiring substrate of the fifth aspect.

It is an object of the present invention to provide a multilayered wiring substrate capable of considerably reduce or eliminate the difference in propagation delay time between signals.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
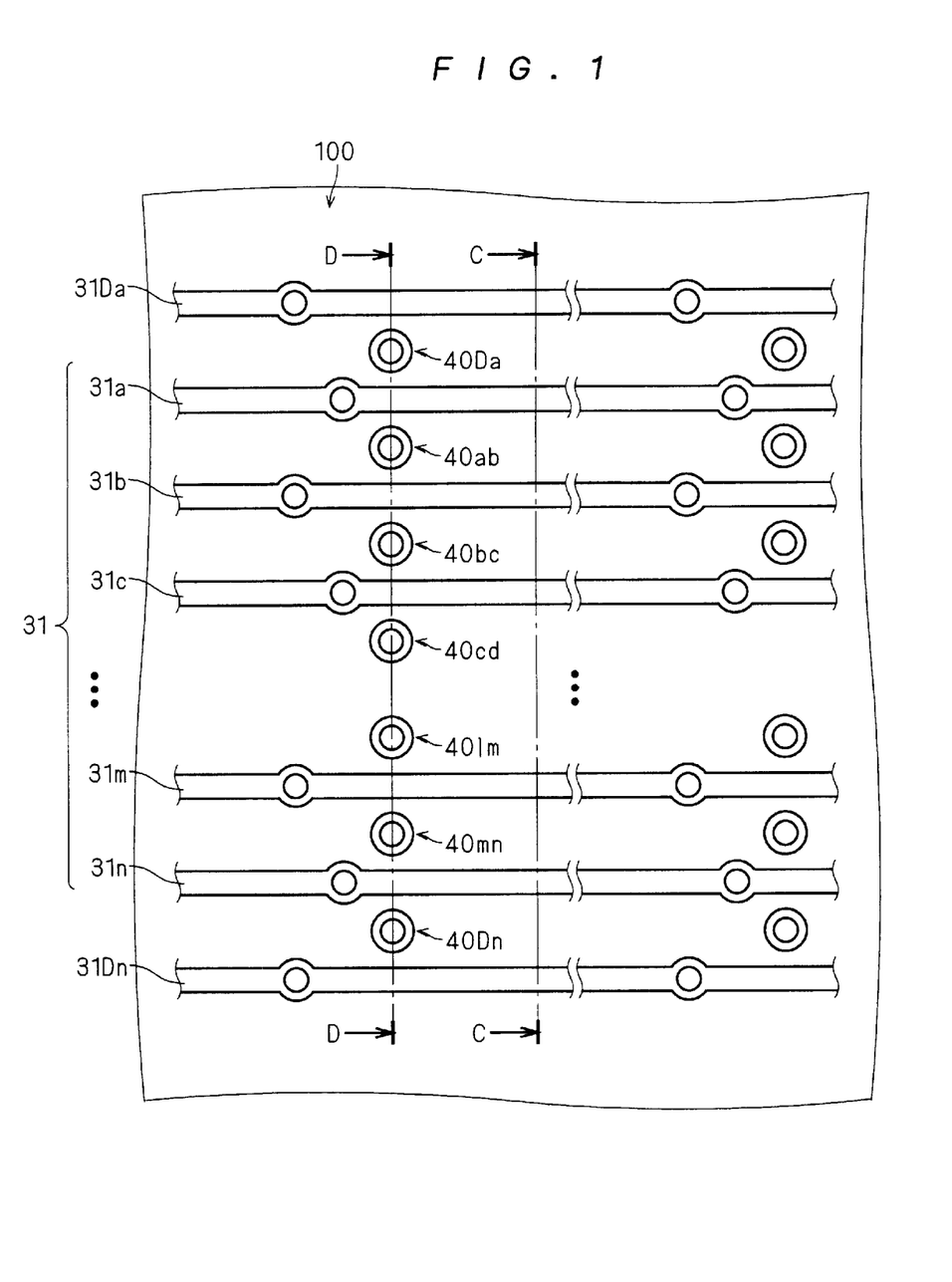
FIG. 1 is a schematic top plan view of a wiring layer in a multilayered wiring substrate according to a first preferred embodiment of the invention.

A multilayered wiring substrate 100 according to a first preferred embodiment comprises a plurality of signal wiring layers, a ground wiring (layer) 35, a power supply wiring (layer) 36, and a plurality of through holes formed in the stacking direction of these wiring layers, as in the conventional multilayered substrate 100P shown in FIGS. 15 to 18. The wirings that form the respective wiring layers and signal wiring layers are isolated each other by an insulating material such as glass epoxy material (see the insulating material 2 stated earlier). Description will now be made by taking, as an example, a signal wiring layer disposed on the surface of the multilayered wiring substrate 100. The same is true for other signal wiring layers. FIG. 1 is a schematic top plan view of the above-mentioned signal wiring layer.

Referring to FIG. 1, the multilayered wiring substrate 100 comprises: (I) a signal wiring group 31 made by n signal wirings 31a to 31n disposed in parallel one another; and (II) dummy wirings 31Da and 31Dn disposed on the outside of the signal wiring group 31, namely, on the side opposite from signal wirings 31b to 31m with respect to the outermost signal wirings 31a and 31n of the signal wiring layer 31, respectively. The dummy wirings 31Da and 31Dn extend in parallel with the signal wirings 31a to 31n. The dummy wirings 31Da and 31Dn have the same shape as the signal wirings 31a to 31n, and are disposed outside the signal wirings 31a and 31n, respectively, at the same intervals as that in the signal wirings 31a to 31n.

The multilayered wiring substrate 100 further comprises: (i) through holes 40ab to 40mn, as previously described, which are formed in the corresponding clearance among the signal wirings 31a to 31n; and (ii) dummy through holes 40Da and 40Dn having the same shape as the through holes 40ab to 40mn, which are formed in the clearance between the dummy wiring 31Da and signal wiring 31a, and between the dummy wiring 31Dn and signal wiring 31n, respectively. As stated above, conductive layers 41ab to 41mn (see FIG. 2 as will hereafter be described) are formed on the inner wall of the through holes 40ab to 40mn, respectively. The conductive layers 41ab to 41mn establish an electrical connection between predetermined wiring layers selected from the above-mentioned wiring layers. Conductive layer (or dummy conductive layer) 41Da and 41Dn (see FIG. 2) which are identical with the conductive layers 41ab to 41mn are formed on the inner wall of the dummy through holes 40Da and 40Dn, respectively. The conductive layers 41ab to 41mn, 41Da, and 41Dn may be formed so as to completely fill the through holes 40ab to 40mn, 40Da, and 40Dn.

The signal wirings 31*b* to 31*m*, through holes 40*ab* to 40*mn*, and conductive layers 41*ab* to 41*mn* are called "normal signal wirings 31*b* to 31*m*," "normal through holes 40*ab* to 40*mn*" and "normal conductive layers 41*ab* to 41*mn*" against the dummy wirings 31D*a* and 31D*n*, dummy through holes 40D*a* and 40D*n*, and dummy conductive layers 41D*a* and 41D*n*.

Figure 2:
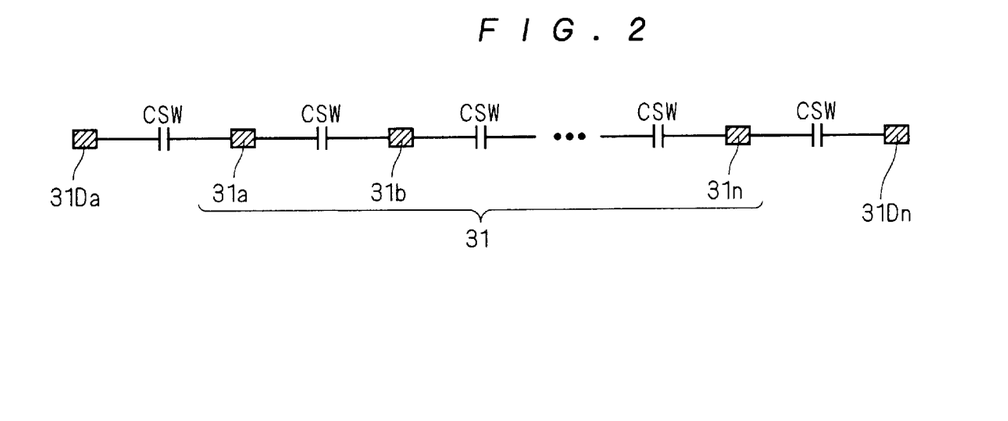
FIG. 2 is a schematic view illustrating a capacitive coupling condition of a plurality of wirings in the multilayered wiring substrate according to the first preferred embodiment of the invention.
Figure 3:
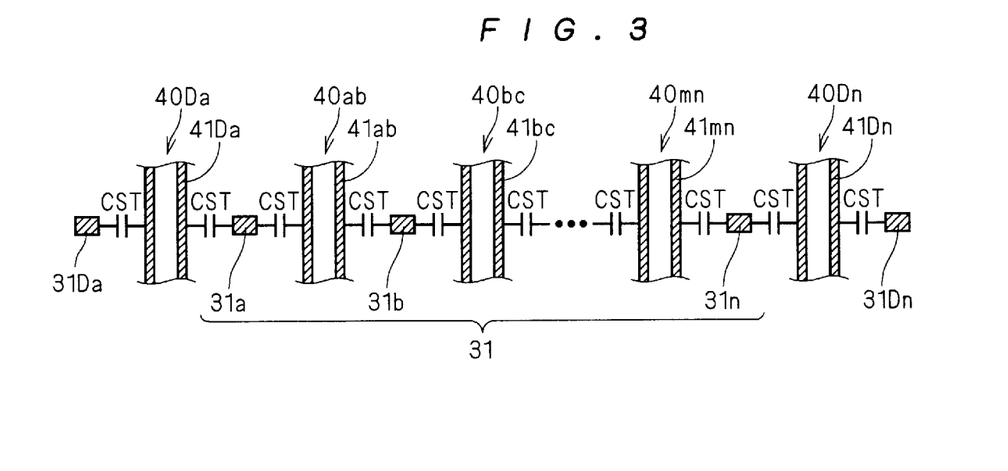
FIG. 3 is a schematic view illustrating a capacitive coupling condition of a plurality of wirings and conductive layers of through holes in the multilayered wiring substrate according to the first preferred embodiment of the invention.

FIG. 2 is a schematic longitudinal section of the multilayered wiring substrate 100 taken along the line C—C of FIG. 1, and FIG. 3 is that taken along the line D—D of FIG. 1. Referring to FIG. 2, in the vicinity of the line C—C of FIG. 1, the signal wirings 31*a* to 31*n* and dummy wirings 31D*a* and 31D*n* are capacitively coupled in series via a capacitance CSW between two adjacent wirings. Referring to FIG. 3, in the vicinity of the line D—D of FIG. 1, the signal wirings 31*a* to 31*n* and the dummy wirings 31D*a* and 31D*n*, and the conductive layers 41*ab* to 41*mn* of the through holes 40*ab* to 40*mn* and the conductive layers 41D*a* and 41D*n* of the dummy through holes 40D*a* and 40D*n*, are capacitively coupled in series via a capacitance CST between one wiring and one conductive layer.

As shown by a comparison of FIGS. 2 and 3 with FIGS. 20 and 21, in the multilayered wiring substrate 100, two capacitance CSW or CST can be coupled to the outermost signal wirings 31*a* and 31*n* of the signal wiring group 31 by the presence of the dummy wirings 31D*a* and 31D*n*, as in the case of the signal wirings 31*b* to 31*m*. Specifically, the line capacitance of the outermost signal wirings 31*a* and 31*n* can be made equal to that of the signal wirings 31*a* to 31*n*.

Thereby, the propagation velocity of all signals propagating along the signal wirings 31*a* to 31*n*, for example, address signals to be inputted to the DRAMs 51 (see FIGS. 15 and 18), can be made equal. Accordingly, the propagation delay time difference Δtpd between the address signals can be considerably reduced, as compared to the conventional multilayered wiring substrate 100P.

As a result, in a memory module using the multilayered wiring substrate 100 instead of the conventional multilayered wiring substrate 100P, the set up time and the hold time can be set a same value respectively among all the signal wirings 31*a* to 31*n*. This allows the DRAM 51 to operate stably and reliably even at high speed operation.

Figure 4:
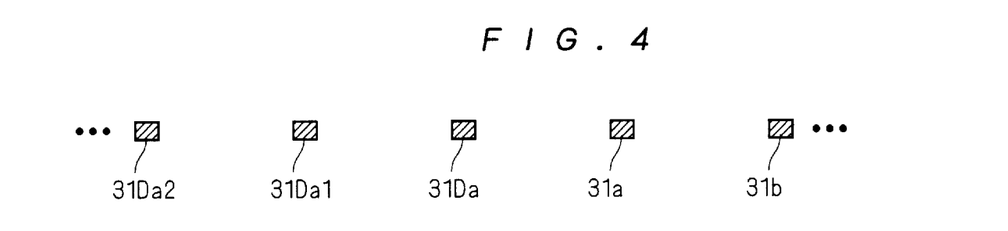
FIG. 4 is a schematic view illustrating a dummy wiring in the multilayered wiring substrate according to the first preferred embodiment of the invention.

In view of the fact that the capacitance CSW or CST depends on the field distribution among wirings or among wirings and the conductive layers of through holes, and that the field exists in all directions from the wiring surface that is a conductor, it is more preferable to provide more dummy wirings 31D*a*1, 31D*a*2, . . . on further outside from the dummy wiring 31D*a* (and dummy wiring 31D*n*), as illustrated by the schematic longitudinal section in FIG. 4. Of course, these dummy wirings 31D*a*, 31D*a*1, 31D*a*2, . . . have the same size as the signal wirings 31*a* to 31*n*, and are disposed at the same intervals as that in the signal wirings 31*a* to 31*n*. It is desirable to provide dummy through holes at the clearances among the dummy wirings 31D*a*, 31D*a*1, 31D*a*2, . . . respectively, that is, adjacent to the dummy wirings 31D*a*, 31D*a*1, 31D*a*2, . . . on the side of the signal wiring group 31, respectively. This enables to provide more uniform electrical influence, such as field distribution, on all the signal wirings 31*a* to 31*n*, thus enhancing the above-mentioned effect of reducing the delay time difference Δtpd. The number of dummy wirings is set based on the number of signal wirings and the shape and size of the multilayered wiring substrate 100.

First Modification of First Preferred Embodiment

Figure 5:
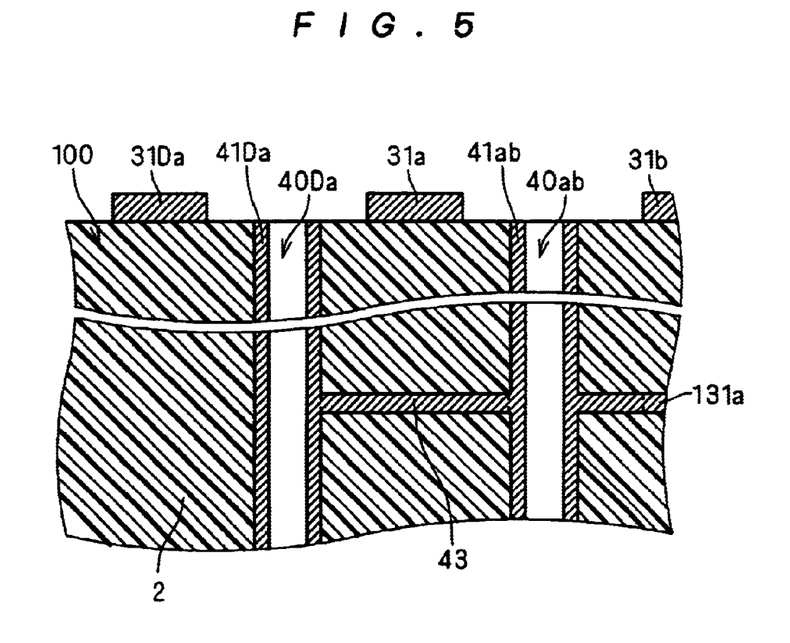
FIG. 5 is a schematic longitudinal section of a multilayered wiring substrate according to a first modification of the first preferred embodiment.

In the case that the multilayered wiring substrate 100 includes a wiring layer having less number of wirings than other wiring layers and having no dummy wiring, the following construction is adaptable. As shown in FIG. 5 which is a schematic longitudinal section of the multilayered wiring substrate 100, in the case that there is a signal wiring layer including an outermost signal wiring 131*a* under a signal wiring 31*b* and no signal wirings under a signal wiring 31*a*, a conductive layer 41D*a* of a dummy through hole 40D*a* may be electrically connected to a normal conductive layer 41*ab* by a connecting wiring 43. The connecting wiring 43 is preferably provided within the signal wiring layer including the signal wiring 131*a*.

With this construction, the electrical influence such as the potential of the conductive layer 41D*a* of the dummy through hole 40D*a* and the field distribution can be made equal to that in the normal conductive layer 41*ab*. Therefore, the electrical influence of the signal wiring 31*a* disposed between the normal through hole 40*ab* and dummy through hole 40D*a* can be made the same as in the signal wirings disposed between other normal through holes. As a result, the above-mentioned propagation delay time difference Δtpd can be more reduced.

Although the foregoing description is directed to the case that the dummy conductive layer 41D*a* is connected to the adjacent normal conductive layer 41*ab*, the dummy conductive layer 41D*a* may be electrically connected to the conductive layer of other through hole that is not shown in FIG. 5. In addition, the normal conductive layer 41*ab* or the like, to which the dummy conductive layer 41D*a* is connected, may be electrically connected to the ground wiring 35 or power supply wiring 36.

Second Modification of First Preferred Embodiment

Figure 6:
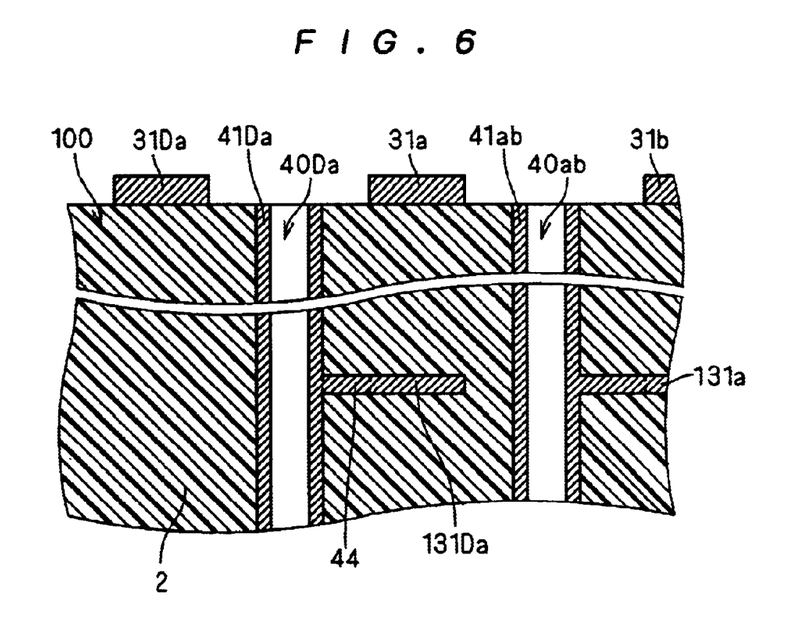
FIG. 6 is a schematic longitudinal section of a multilayered wiring substrate according to a second modification of the first preferred embodiment.

In the multilayered wiring substrate 100 according to the first modification, there is a case that the conductive layer 41D*a* of the dummy through hole 40D*a* may act as load of a signal propagating along the signal wiring 131*a*. This might increase the delay and waveform distortion of the signal. The increased delay can be reduced or eliminated by a multilayered wiring substrate 100 having the construction according to a second modification. FIG. 6 is a schematic longitudinal section of a multilayered wiring substrate 100 according to the second modification. As shown in FIG. 6, a dummy wiring 131D*a* corresponding to the dummy wiring 31D*a* is disposed outside a signal wiring 131*a*, and the dummy wiring 131D*a* and a conductive layer 41D*a* of a dummy through hole 40D*a* are electrically connected via a connecting wiring 44.

With this construction, the increased delay in the signal can be suppressed because the dummy conductive layer 41D*a* is not directly connected to the normal conductive layer 41*ab*. In this case, the dummy wiring 131D*a* is preferably provided in a signal wiring layer including the signal wiring 131*a*. Of course, the dummy wiring 131D*a* offers the above-mentioned effect of reducing the delay time difference Δtpd.

Second Preferred Embodiment

Figure 7:
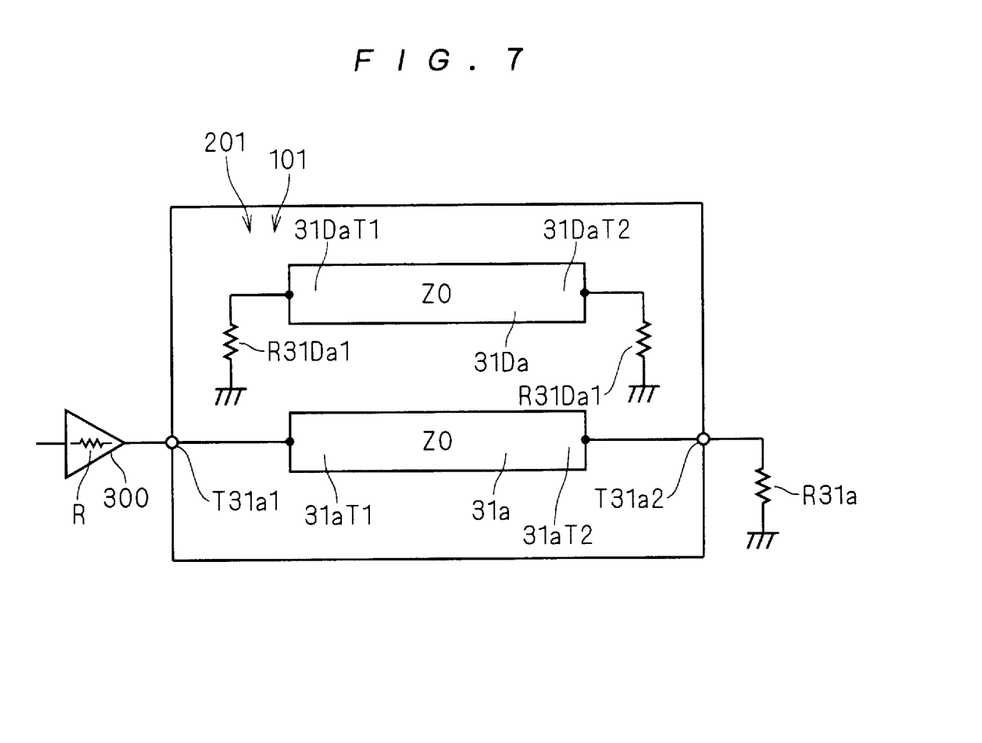
FIG. 7 is a schematic top plan view of a memory module according to a second preferred embodiment.

A memory module 201 to which a multilayered wiring substrate 100 is applied will be described by referring to FIG. 7, which is a schematic top plan view of the memory module 201. To avoid confusion, only a signal wiring 31*a* and dummy wiring 31D*a* of the above-mentioned wirings are schematically illustrated in FIG. 7. The following description of the signal wiring 31*a* and dummy wiring 31D*a* is true for signal wirings 31*b* to 31*n* and the dummy wiring 31D*n*. Since the construction of the DRAM 51, etc. is the same as that of the conventional memory module 200P, its illustration is omitted in FIG. 7. The same is true for FIGS. 8 to 14 as will hereafter be described. The memory module 201 is of the type, e.g., RIMM (Rambus Inline Memory Module), in which an address signal is inputted from an (external) terminal T31a1 of the input side of the module 201 and the inputted address signal is not only transferred to a DRAM but also outputted from an (external) terminal T31a2 on the output side.

Referring to FIG. 7, in the memory module 201 the end part 31aT1 on the input side of the signal wiring 31a is electrically connected to an external circuit or a driver circuit 300 via the terminal T31a1 on the input side of the memory module 201. The driver circuit 300 has approximately the same output impedance value R as the characteristic impedance Z0 of the signal wiring 31a. The end part 31aT2 on the output side of the signal wiring 31a is electrically connected to the terminal T31a2 on the output side of the memory module 201, and the terminal T31a2 is electrically connected via a resistance R31a to a ground wiring 35 (see FIG. 16) for terminating. The resistance R31a is a terminating resistance having approximately the same impedance value as the characteristic impedance Z0 of the signal wiring 31a. The terminal T31a2 may be electrically connected via the resistance R31a to the power supply wiring 36 (see FIG. 16). The same is true for the following description. Thus, the signal wiring 31a transfers address signals in its impedance matching state at both end parts 31aT1 and 31aT2 on the input and output sides, respectively.

The multilayered wiring substrate 101 applied to the memory module 201 further comprises a resistance R31Da1 disposed on the above-mentioned multilayered wiring substrate 100. Specifically, both end parts 31DaT1 and 31DaT2 on the input and output sides of the dummy wiring 31Da, respectively, are grounded via a resistance R31Da1. For the sake of convenience, the end parts on the input and output sides of the dummy wiring 31Da correspond to the end parts of the input and output sides of the signal wiring 31a, respectively. The resistance R31Da1 has approximately the same impedance value as the characteristic impedance Z0 (being equal to that of the signal wiring 31a) of the dummy wiring 31Da, and the dummy wiring 31Da is in its impedance matching condition, at both end parts 31DaT1 and 31DaT2. The resistance R31Da1 is made by a chip resistance, and it is mounted on the surface of the multilayered wiring substrate 101 and connected by soldering between the dummy wiring 31Da and ground wiring 35.

Thus, in accordance with the multilayered wiring substrate 101 and memory module 201, the electrically connected condition of the dummy wiring 31Da can be made equal to that of the signal wiring 31a. This ensures the above-mentioned effect of reducing the propagation delay time difference Δtpd, thereby making high speed operation of the DRAM 51 stable and reliable. Modifications of the multilayered wiring substrate 101 and memory module 201 will be described as below. The same effect is also obtainable with any construction of first to fourth modifications.

First Modification of Second Preferred Embodiment

Figure 8:
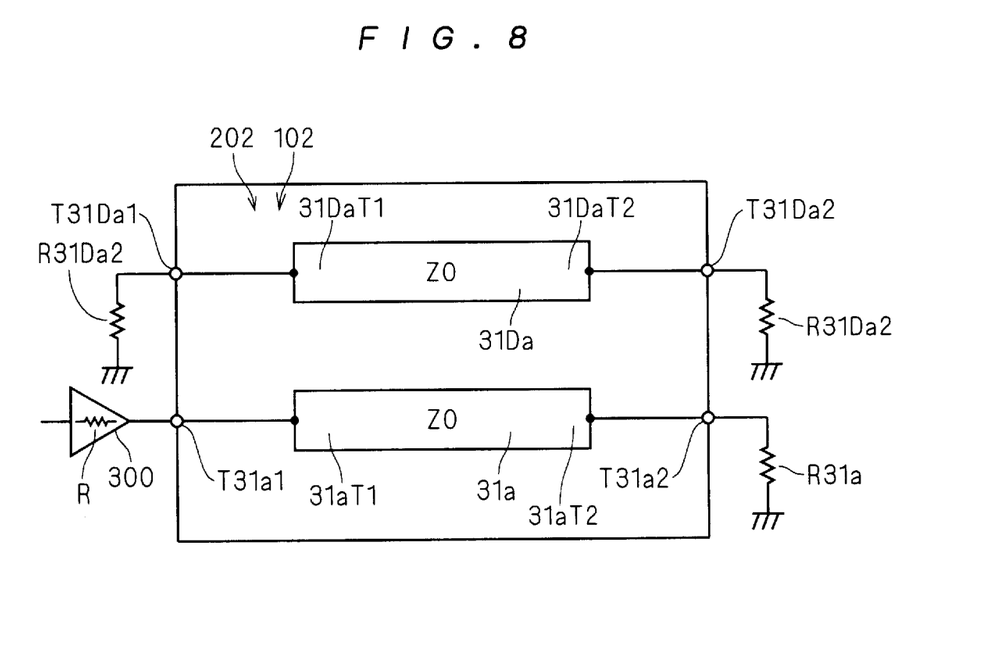
FIG. 8 is a schematic top plan view of a memory module according to a first modification of the second preferred embodiment.

FIG. 8 is a schematic top plan view of a memory module 202 according to a first modification of the second preferred embodiment. As shown by comparison of FIG. 8 with FIG. 7, in a multilayered wiring substrate 102 applied to the memory module 202, end parts 31DaT1 and 31DaT2 on the input and output sides of a dummy wiring 31Da are electrically connected to a terminal (terminal for connecting terminating resistance) T31Da1 on the input side and a terminal (terminal for connecting terminating resistance) T31Da2 on the output side of the memory module 202, respectively. The terminals T31Da1 and T31Da2 are grounded via a terminating resistance R31Da2 provided outside the memory module 202.

Thus, in the multilayered wiring substrate 102 and memory module 202, the resistance R31Da is provided outside the multilayered wiring substrate 102. It is therefore easy to set or change the resistance value of the resistance R31Da. At this time, depending on selection or setting of the resistance R31Da, a further reduction in power consumption is attainable as compared with the memory module 201. Of course, a resistance which has approximately the same impedance as the characteristic impedance Z0 previously described can be used as a resistance R31Da2.

Second Modification of Second Preferred Embodiment

Figure 9:
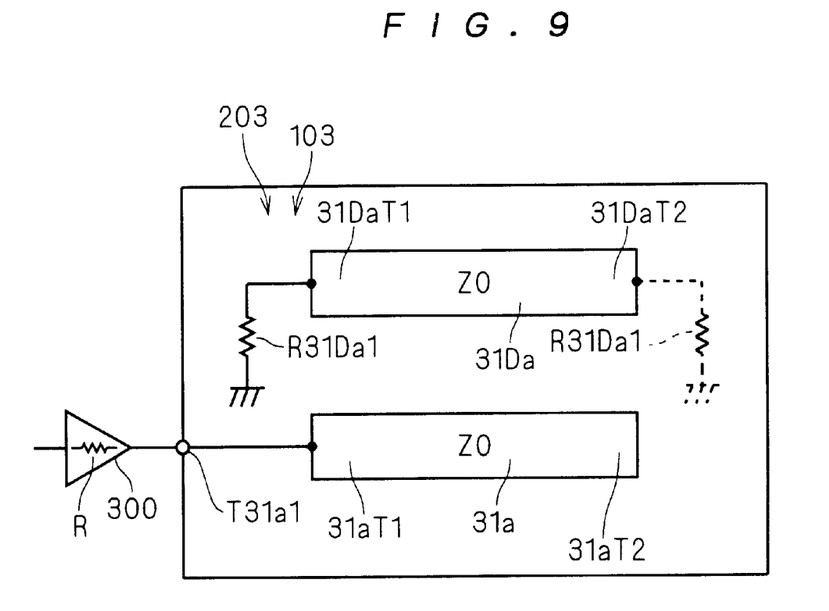
FIG. 9 is a schematic top plan view of a memory module according to a second modification of the second preferred embodiment.

FIG. 9 is a schematic top plan view of a memory module 203 according to a second preferred embodiment of the second preferred embodiment. The memory module 203 is of the type, e.g., DIMM (Double Inline Memory Module), in which an address signal is inputted via a terminal T31a1 on the input side of the module 203 from an end part 31aT1 on the input side of a signal wiring 31a and then transferred to a DRAM and an end part 31aT2 on the output side of the signal wiring 31a is not terminated. Specifically, a comparison of FIG. 9 with FIG. 7 indicates that in the memory module 203 the resistance R31a is not connected to the end part 31aT2 on the output side of the signal wiring 31a.

Correspondingly, in a multilayered wiring substrate 103 applied to the memory module 203, a terminating resistance R31Da1 is electrically connected only to an end part 31DaT1 on the input side of a dummy wiring 31Da. The end parts 31aT2 on the output side of the dummy wiring 31Da may be terminated at a resistance R31Da1 or R31Da2.

Figure 10:
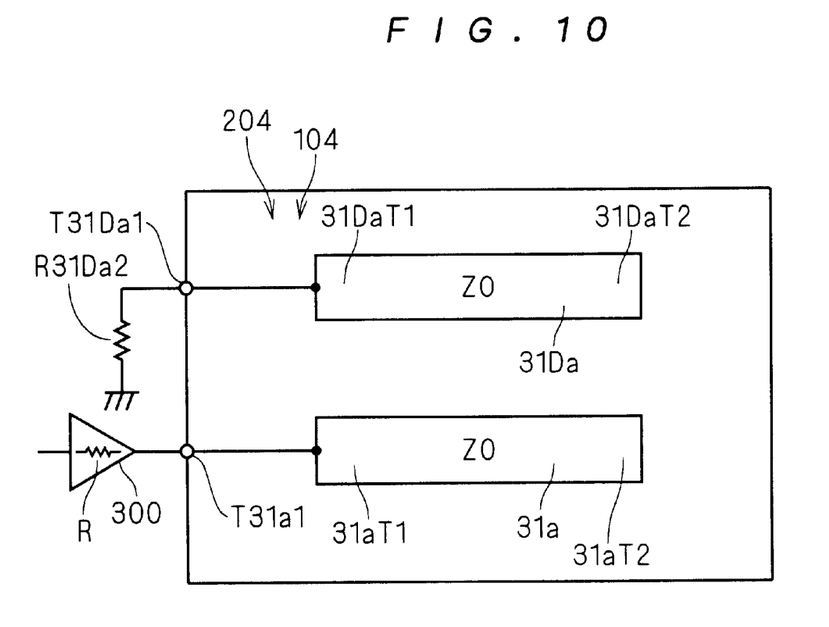
FIG. 10 is a schematic top plan view of other memory module according to the second modification of the second preferred embodiment.

Like a multilayered wiring substrate 104 of a memory module 204 as shown in FIG. 10, an end part 31DaT1 on the input side of a dummy wiring 31Da may be electrically connected to a terminal T31Da1 on the input side, and the resistance R31Da2 may be connected to the terminal T31Da1. Again, an end part 31aT2 on the output side of the dummy wiring 31Da may be terminated at the resistance R31Da1 or R31Da2.

Third Modification of Second Preferred Embodiment

Figure 11:
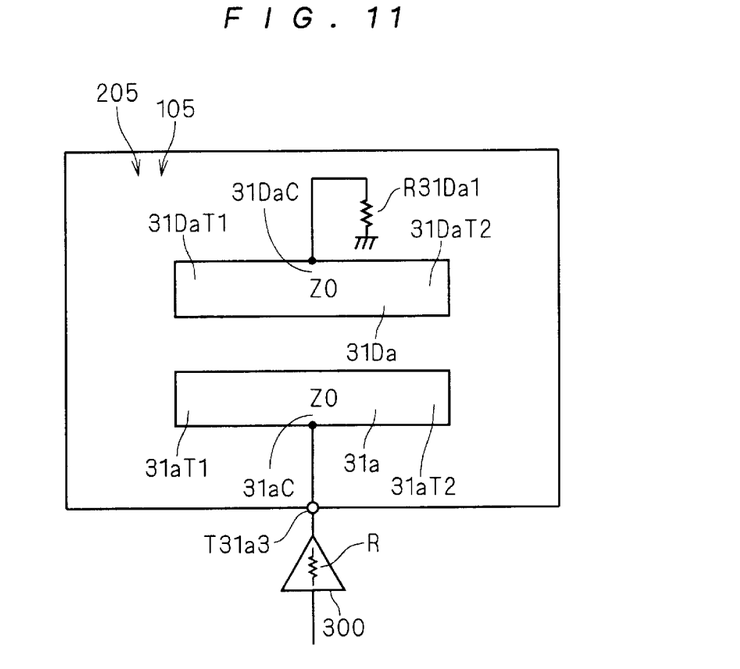
FIG. 11 is a schematic top plan view of a memory module according to a third modification of the second preferred embodiment.

FIG. 11 is a schematic top plan view of a memory module 205 according to a third modification of the second preferred embodiment. The memory module 205 is of the type, e.g., DIMM type memory module, in which an address signal is inputted from a central part 31aC of a signal wiring 31a and transferred to a DRAM. This type memory module is often used for reducing by half the propagation delay time tpd of an address signal on the memory module.

Referring to FIG. 11, in the memory module 205 a driver circuit 300 is electrically connected via an (external) terminal T31a3 to the central part 31aC of the signal wiring 31a in the direction of length of the signal wiring 31a. Correspondingly, in a multilayered wiring substrate 105 applied to the memory module 205, a resistance R31Da1 is electrically connected to a central part 31DaC of the signal wiring 31Da in the direction of length of a dummy wiring 31Da.

Figure 12:
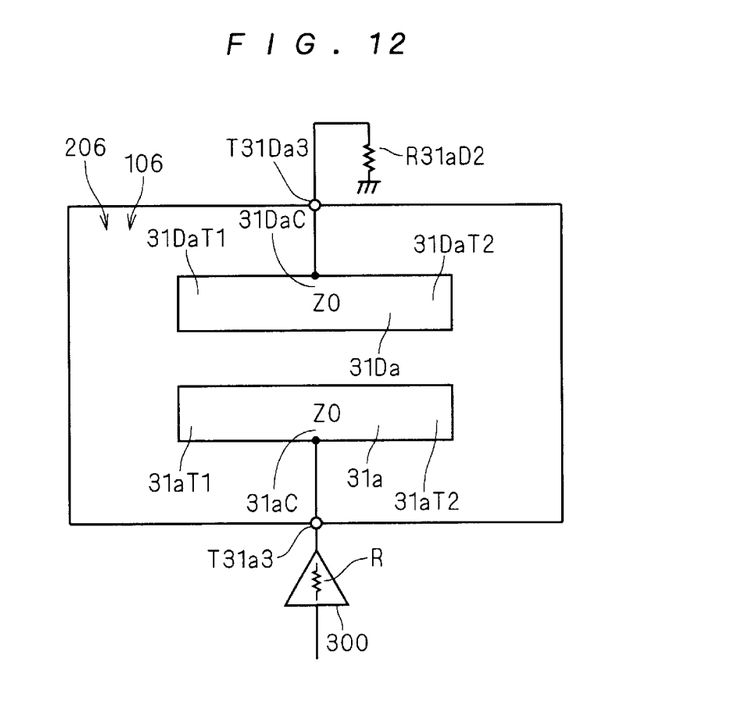
FIG. 12 is a schematic top plan view of another memory module according to the third modification of the second preferred embodiment.

Like a multilayered wiring substrate 106 of a memory module 206 shown in FIG. 12, the central part 31DaC of the dummy wiring 31Da may be electrically connected to a terminal (terminal for connecting terminating resistance) T31Da3, and a resistance R31Da2 may be electrically connected to a terminal T31Da3.

Fourth Modification of Second Preferred Embodiment

Figure 13:
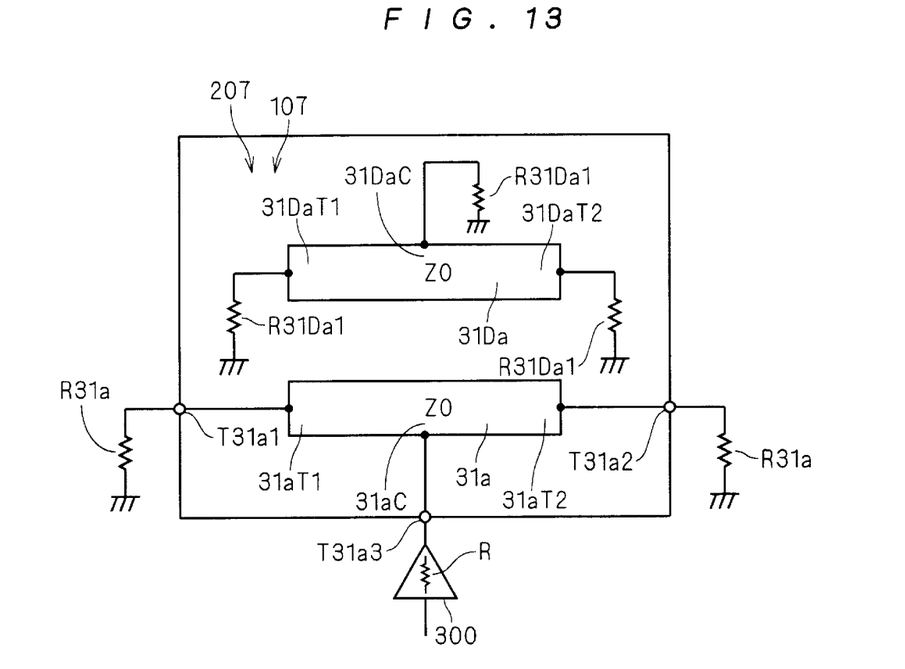
FIG. 13 is a schematic top plan view of a memory module according to a fourth modification of the second preferred embodiment.

FIG. 13 is a schematic top plan view of a memory module 207 according to a fourth modification of the second preferred embodiment. As shown by comparison of FIG. 13 with FIG. 11, in the memory module 207, end parts 31aT1 and 31aT2 of a signal wiring 31a is electrically connected to terminals T31a1 and T31a2 and then grounded via resistances R31a, respectively. Correspondingly, in a multilayered wiring substrate 107 applied to the memory module 207, the above-mentioned resistance R31Da1 is electrically connected to end parts 31DaT1 and 31DaT2 of a dummy wiring 31Da, respectively, in addition to a central part 31DaC.

Figure 14:
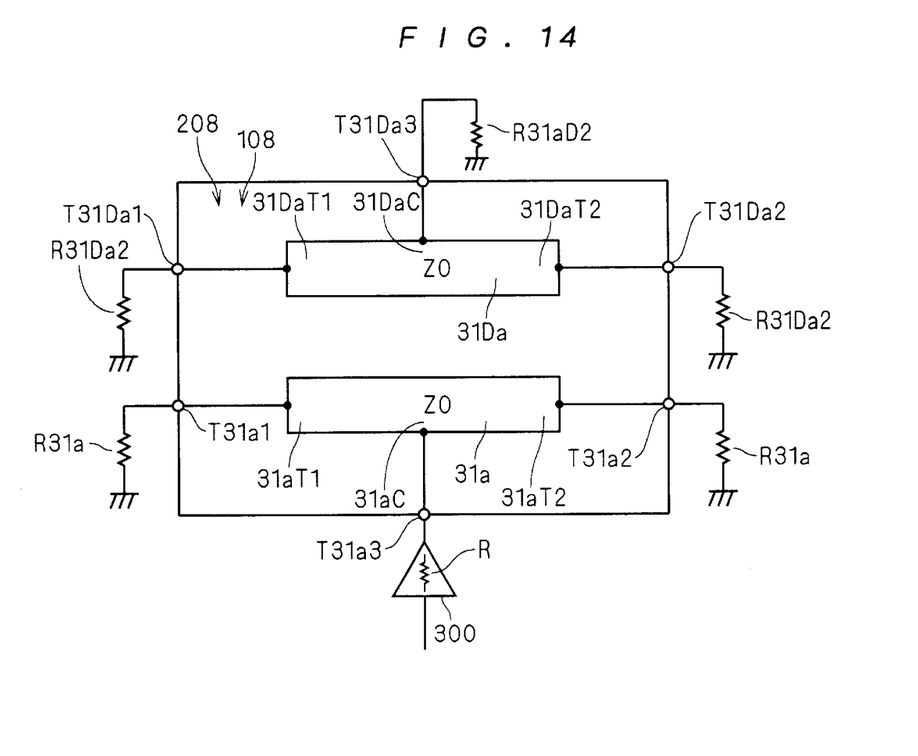
FIG. 14 is a schematic top plan view of another memory module according to the fourth modification of the second preferred embodiment.

Like a multilayered wiring substrate 108 of a memory module 208 as shown in FIG. 14, end parts 31DaT1 and 31DaT2 and a central part 31DaC of a dummy wiring 31Da may be electrically connected to terminals T31Da1, T31Da2 and T31Da3, respectively, and the resistance R31Da2 may be electrically connected to the terminal T31Da1, T31Da2 and T31Da3, respectively.

In the foregoing first to fourth modifications, when two or more of resistance R31Da1 or R31Da2 are electrically connected to a dummy wiring 31Da, any connecting conditions in various combinations are adaptable. For example, the end part 31DaT1 is electrically connected to the resistance R31Da1, and the end part 31DaT2 is electrically connected via the terminal T31Da2 to the resistance R31Da2.

Furthermore, a variable resistance may be used as resistances R31Da1, R31Da2 and R31Da3. The resistances R31Da1, R31Da2 and R31Da3 may be electrically connected to a ground wiring or power supply wiring of the memory modules 201 to 208. Of course, the signal wirings 31a to 31n are adaptable as a variety of data input/output lines for transferring signals other than address signals.

While the invention has been shown and described in detail, the foregoing description is in all aspects illustrative and not restrictive. It is therefore understood that numerous modifications and variations can be devised without departing from the scope of the invention.

What is claimed is:

1. A multilayered wiring substrate, comprising:
    a plurality of multilayered wiring layers, at least one of said multilayered wiring layers comprising a signal wiring group made by a plurality of signal wirings disposed in parallel with one another; and
    dummy wirings disposed in said at least one of said multilayered wiring layers, outside said signal wiring group, and in parallel to said signal wirings, at least one of said dummy wirings being disposed at each side of said signal wiring group.

2. The multilayered wiring substrate according to claim 1, further comprising:
    through holes formed in a stacking direction of said wiring layers and disposed in each clearance between said signal wirings;
    a dummy through hole extending in said stacking direction, disposed adjacent to said dummy wiring on the side on which said signal wiring group is present; and
    conductive layers disposed inside said through holes and said dummy through hole, respectively.

3. The multilayered wiring substrate according to claim 2 wherein
    said conductive layer in said dummy through hole is electrically connected to said conductive layer in any one of said through holes.

4. The multilayered wiring substrate according to claim 2 wherein
    said conductive layer in said dummy through hole is electrically connected to said dummy wiring.

5. The multilayered wiring substrate according to claim 1, further comprising
    at least one resistance having approximately the same impedance as a characteristic impedance of said dummy wiring, and being electrically connected to an end or central part of said dummy wiring.

6. The multilayered wiring substrate according to claim 1, further comprising
    at least one terminal for connecting a terminating resistance connected electrically to an end or central part of said dummy wiring.

7. The multilayered wiring substrate according to claim 1, wherein a distance between a dummy wiring adjacent to said signal wirings and said signal wirings is equal to a distance between two adjacent signal wirings of said signal wirings.

8. The multilayered wiring substrate according to claim 1, wherein a distance between any adjacent dummy wirings is equal to a distance between any adjacent signal wirings.

9. The multilayered wiring substrate according to claim 7, wherein a distance between any adjacent dummy wirings is equal to a distance between any adjacent signal wirings.

10. A multilayered wiring substrate, comprising:
    a plurality of multilayered wiring layers, at least one of said multilayered wiring layers comprising a signal wiring group made by a plurality of signal wirings disposed in parallel with one another;
    through holes formed in a stacking direction of said wiring layers and disposed in each clearance between said signal wirings;
    a dummy through hole extending in said stacking direction, disposed outside said signal wiring group; and
    conductive layers disposed inside said through holes and said dummy through hole, respectively.

11. The multilayered wiring substrate according to claim 10, wherein said conductive layer in said dummy through hole is electrically connected to said conductive layer in any one of said through holes.

* * * * *

UNITED STATES PATENT AND TRADEMARK OFFICE
CERTIFICATE OF CORRECTION

PATENT NO. : 6,630,627 B1
DATED : Oct. 7, 2003
INVENTOR(S) : Tobita

It is certified that error appears in the above-identified patent and that said Letters Patent is hereby corrected as shown below:

Title page, Item [54] and Column 1 line 1,
Title, should read: -- [54] MULTILAYERED WIRING SUBSTRATE WITH DUMMY WIRINGS IN PARALLEL TO SIGNAL WIRINGS -- , Title page,
Item [75], Inventor should read -- Youichi Tobita, Tokyo (JP)
Item [73], Assignee, should read -- [73] Assignee: Mitubishi Denki Kabushiki Kaisha, Tokyo (JP) --

Signed and Sealed this

Twenty-fifth Day of May, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,630,627 B1
DATED : October 7, 2003
INVENTOR(S) : Tobita

It is certified that error appears in the above-identified patent and that said Letters Patent is hereby corrected as shown below:

Title page, Item [54] and Column 1, line 1,
Title, should read: -- MULTILAYERED WIRING SUBSTRATE WITH DUMMY WIRINGS IN PARALLEL TO SIGNAL WIRINGS --

Title page,
Item [75], Inventor, should read
-- [75] Inventor: Youichi Tobita, Tokyo (JP) --
Item [73], Assignee, should read
-- [73] Assignee: Mitsubishi Denki Kabushiki Kaisha, Tokyo (JP) --

Signed and Sealed this

Thirtieth Day of November, 2004

JON W. DUDAS
*Director of the United States Patent and Trademark Office*